United States Patent
Tan

(10) Patent No.: US 8,956,206 B2
(45) Date of Patent: Feb. 17, 2015

(54) AIR PARTITION MEMBER

(75) Inventor: Liang Tan, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

(*) Notice: Subject to any disclaimer, the term of this patent is extended or adjusted under 35 U.S.C. 154(b) by 592 days.

(21) Appl. No.: 13/197,774

(22) Filed: Aug. 4, 2011

(65) Prior Publication Data

US 2013/0026404 A1    Jan. 31, 2013

(30) Foreign Application Priority Data

Jul. 28, 2011  (CN) .......................... 2011 1 0213290

(51) Int. Cl.
H05K 5/00       (2006.01)
H05K 7/20       (2006.01)

(52) U.S. Cl.
CPC ............. *H05K 7/20727* (2013.01); *H05K 7/20* (2013.01); *H05K 7/20145* (2013.01)
USPC ............................ 454/184; 454/169; 361/690

(58) Field of Classification Search
CPC .. H05K 7/20; H05K 7/20145; H05K 7/20727

USPC .......................................... 454/184; 361/690
See application file for complete search history.

(56) References Cited

U.S. PATENT DOCUMENTS

| 6,105,654 | A  | * | 8/2000 | Martel ........................... 160/135 |
| 6,991,533 | B2 | * | 1/2006 | Tsai et al. ..................... 454/184 |
| 7,999,179 | B2 | * | 8/2011 | Eckberg et al. ................. 174/50 |
| 8,102,651 | B2 | * | 1/2012 | Bland et al. .................... 361/695 |
| 2010/0212877 | A1 | * | 8/2010 | Chen et al. ..................... 165/185 |
| 2011/0051358 | A1 | * | 3/2011 | Searby et al. ............. 361/679.48 |
| 2011/0053485 | A1 | * | 3/2011 | Huang et al. ................... 454/184 |
| 2011/0080700 | A1 | * | 4/2011 | Bland et al. ................ 361/679.5 |
| 2012/0325358 | A1 | * | 12/2012 | Lin et al. ....................... 138/103 |
| 2014/0148086 | A1 | * | 5/2014 | Cash et al. ..................... 454/184 |

\* cited by examiner

*Primary Examiner* — Steven B McAllister
*Assistant Examiner* — Frances H Kamps
(74) *Attorney, Agent, or Firm* — Novak Druce Connolly Bove + Quigg LLP

(57) ABSTRACT

An air partition member includes a main body, a sliding plate slidably received in the main body, and two side plates. One of the plates is pivotably connected to a first end of the main body. The other side plate is pivotably connected to a distal end of the sliding plate away from the first end of the main body.

3 Claims, 2 Drawing Sheets

AIR PARTITION MEMBER

BACKGROUND

1. Technical Field

The present disclosure relates to an air partition member for guiding air flow generated by fans in different servers.

2. Description of Related Art

Air partition members may be used to guide air to dissipate heat generated by elements mounted on circuit boards. Generally, an air partition member is a rectangular planar board. As a result, if the number of the fans or the position of the elements changes, the air partition may not guide the air flow effectively. Thus, the heat may not be removed rapidly enough.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
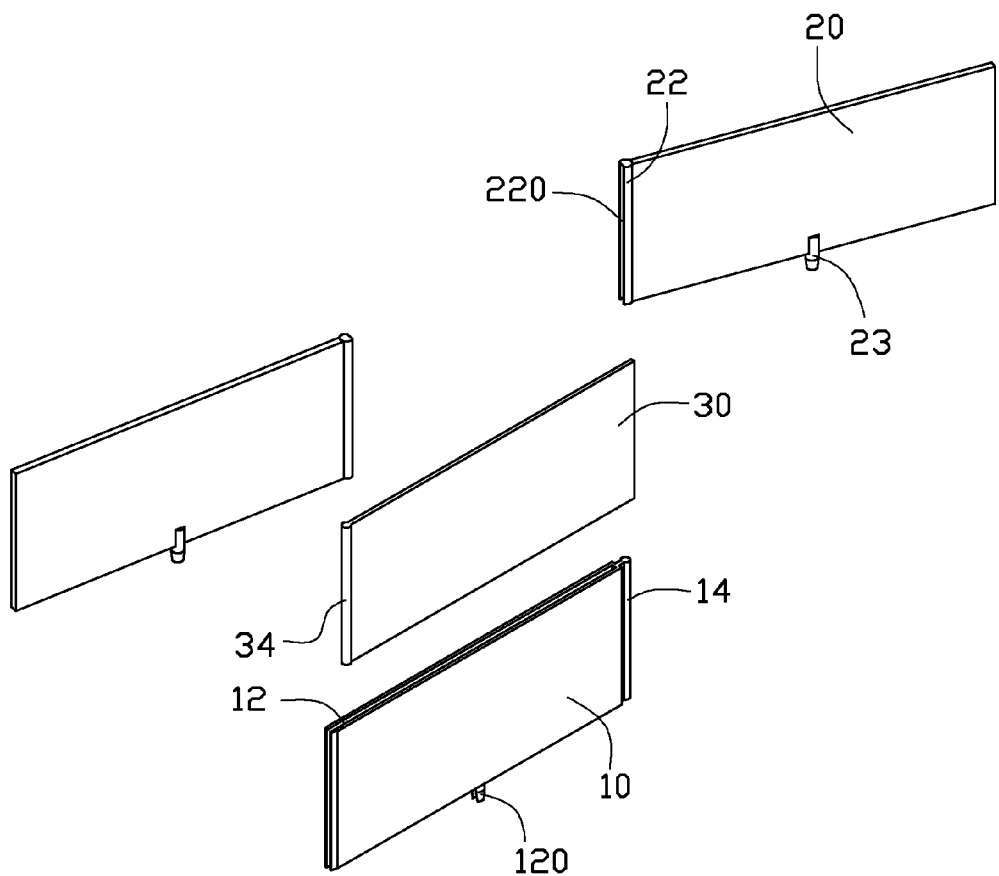
FIG. 1 is an exploded, isometric view of an exemplary embodiment of an air partition member.

Referring to FIG. 1, an exemplary embodiment of an air partition member includes a rectangular main body 10, two rectangular side plates 20, and a rectangular sliding plate 30.

The main body 10 defines a slide slot 12 extending through the top and a first end of the main body 10. A latch 120 extends down from the center of the bottom of the main body 10. A pole 14 is formed at a second end of the main body 10 opposite to the first end.

A fixing portion 22 is formed at an end of each side plate 20. A latch 23 extends down from the center of the bottom of each side plate 20. An engaging slot 220, the cross-section of which is substantially C-shaped, is defined in the fixing portion 22.

A pole 34 is formed at an end of the sliding plate 30.

Figure 2:
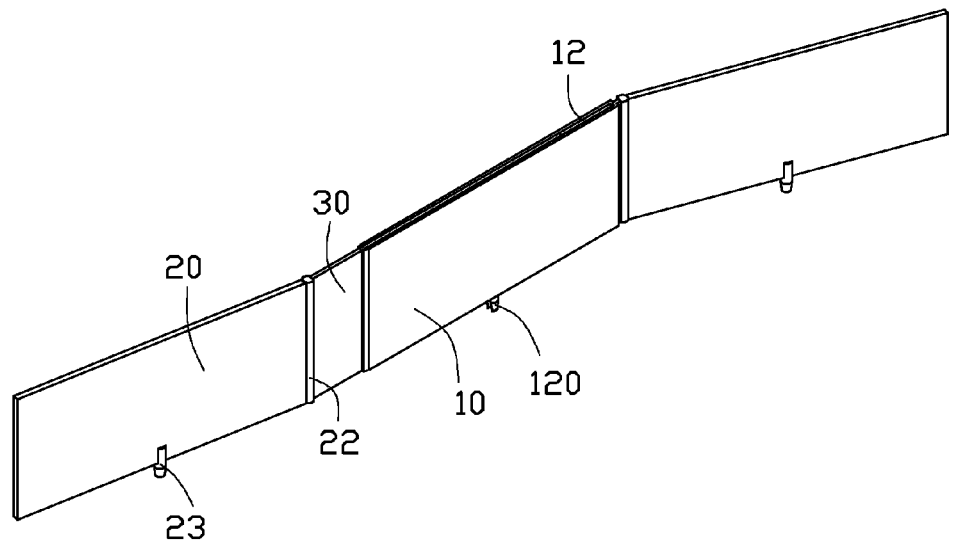
FIG. 2 is an assembled, isometric view of FIG. 1.

Referring to FIG. 2, in assembly, the sliding plate 30 is slidably inserted into the slide slot 12. The pole 34 is located outside the main body 10. The engaging slots 220 of the side plates 20 receive the poles 14 and 34, respectively. Therefore, the side plates 20 are pivotably connected to a second end of the main body 10 opposite to the first end and a distal end of the sliding plate 30 away from the second end of the main body 10, respectively. The latches 120 and 23 are inserted in fixing holes defined in a circuit board (not shown), to fix the air partition member to the circuit board. Adjusting how far the sliding plate 30 is received in the slide slot 12 can change a length of the partition member. Rotating the side plates 20 about the corresponding poles 34 and 14 can adjust a shape of the partition member. Therefore, the air flow can be adjusted by adjusting the partition member to suit different situations.

It is believed that the present embodiments and their advantages will be understood from the foregoing description, and various changes may be made thereto without departing from the spirit and scope of the description or sacrificing all of their material advantages, the examples hereinbefore described merely being exemplary embodiments.

What is claimed is:

1. An air guiding system, comprising:
   a circuit board
   a main body configured for connection to the circuit board, the main body comprising a first plate and a first pole, the first pole located at a first end, the first plate comprising a receiving portion;
   a sliding plate, slidably received in the main body first plate, the sliding plate comprising a second pole;
   two side plates, one of the side plates is pivotably connected to the first pole, the other side plate is pivotably connected to the second pole; and
   wherein the main body receiving portion defines a slide slot extending into the first plate at a second end of the main body opposite to the first end to receive the sliding plate;
   wherein air is guided over the circuit board by the guiding system.

2. The air partition member of claim 1, wherein each side plate comprising a pivotable fixing portion defining an engaging slot, the cross-section of the engaging slot is substantially C-shaped.

3. The air partition member of claim 1, wherein a latch extends down from a bottom of each of the main body and the side plates.

* * * * *